US010332891B1

(12) United States Patent
    Wang

(10) Patent No.: US 10,332,891 B1
(45) Date of Patent: Jun. 25, 2019

(54) METHOD AND DEVICE TO REDUCE FINFET SRAM CONTACT RESISTANCE

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Nan Wang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/967,471

(22) Filed: Apr. 30, 2018

(30) Foreign Application Priority Data

Dec. 11, 2017 (CN) .......................... 2017 1 1306021

(51) Int. Cl.
  *G11C 11/00*   (2006.01)
  *H01L 27/11*   (2006.01)
  *G11C 11/412*  (2006.01)
  *H01L 29/66*   (2006.01)
  *H01L 27/088*  (2006.01)

(52) U.S. Cl.
  CPC ............ *H01L 27/11* (2013.01); *G11C 11/412* (2013.01); *H01L 27/0886* (2013.01); *H01L 29/6681* (2013.01)

(58) Field of Classification Search
  CPC ....... G11C 11/00; G11C 11/412; H01L 27/11; H01L 27/0886; H01L 29/6681
  USPC .......................................................... 365/154
  See application file for complete search history.

(56) References Cited

U.S. PATENT DOCUMENTS

| 9,012,287 | B2 * | 4/2015 | Liaw | ................... | H01L 27/1104 |
| | | | | | 438/283 |
| 9,196,548 | B2 * | 11/2015 | Rashed | ................. | H01L 21/845 |
| 2014/0183638 | A1 * | 7/2014 | Rashed | ................. | H01L 21/845 |
| | | | | | 257/350 |

* cited by examiner

*Primary Examiner* — Harry W Byrne
(74) *Attorney, Agent, or Firm* — Kilpatrick Townsend & Stockton LLP

(57) ABSTRACT

A static random access memory includes a substrate, fins on the substrate and including a first fin for a first pull-up transistor, a second fin for a second pull-up transistor, a third fin for a first pass-gate transistor and a first pull-down transistor, and a fourth fin for a second pass-gate transistor and a second pull-down transistor, dummy fins on the substrate, gate structures on the fins for forming transistors, first and second recesses in the fins on opposite sides of the gate structures, third recesses in the dummy fins, a first epitaxial region in the first recess, a second epitaxial region in the second recess, a third epitaxial region in the third recess, a merged epitaxial region including the third epitaxial region and the first epitaxial region or the third epitaxial region and the second epitaxial region, and a contact member on the merged epitaxial region.

14 Claims, 6 Drawing Sheets

US 10,332,891 B1

METHOD AND DEVICE TO REDUCE FINFET SRAM CONTACT RESISTANCE

CROSS-REFERENCES TO RELATED APPLICATIONS

The present application claims priority to Chinese patent application No. 201711306021.6, filed with the State Intellectual Property Office of People's Republic of China on Dec. 11, 2017, the content of which is incorporated herein by reference in its entirety.

TECHNICAL FIELD

The present invention relates to semiconductor memory devices, and more particularly to a static random access memory device and method for manufacturing the same.

BACKGROUND OF THE INVENTION

Static random access memory (SRAM) devices have the characteristics of high speed and low power consumption. Therefore, SRAM devices are widely used in personal communications devices and consumer electronics.

FIG. 1 is a circuit diagram of a basic SRAM cell structure that may be used for embodiments of the present invention. Referring to FIG. 1, a basic SRAM cell includes two pull-up transistors (PU1 and PU2), two pull-down transistors (PU1 and PU2), and two pass-gate transistors (PG1 and PG2).

As feature sizes continue to decrease, fin-type transistors, such as fin field effect transistors (finFETs), have been used to replace planar transistors in logic devices. Some transistors (e.g., PU1) may be formed on a fin. For example, the gate of PU1 is formed on the fin, and the source region and the drain region of PU1 are formed on the regions on opposite sides of the gate. Thus, when a contact is formed on the source region of PU1 (i.e., the contact for applying a power supply voltage Vdd), the contact area is limited due to the small area of the fin, resulting in a large contact resistance.

BRIEF SUMMARY OF THE INVENTION

Embodiments of the present invention provide a novel SRAM cell structure and method for manufacturing the same to reduce contact resistance.

In accordance to the present invention, a static random access memory may include a substrate, fins on the substrate and including a first fin for a first pull-up transistor, a second fin for a second pull-up transistor, a third fin for a first pass-gate transistor and a first pull-down transistor, and a fourth fin for a second pass-gate transistor and a second pull-down transistor, dummy fins on the substrate, gate structures on the fins for forming transistors, first and second recesses in the fins on opposite sides of the gate structures, third recesses in the dummy fins, a first epitaxial region in the first recess, a second epitaxial region in the second recess, a third epitaxial region in the third recess, a merged epitaxial region including the third epitaxial region and the first epitaxial region or the third epitaxial region and the second epitaxial region, and a contact member on the merged epitaxial region.

In one embodiment, a particular dummy fin associated with a particular fin is disposed on one side of a gate structure on that particular fin.

In one embodiment, the merged epitaxial region includes a source region of a first pull-up transistor, a source region of a second pull-up transistor, a source region of a first pass-gate transistor, a source region of a first pull-down transistor, a source region of a second pass-gate transistor, or a source region of a second pull-down transistor.

In one embodiment, the first fin and the second fin are disposed between the third fin and the fourth fin.

In one embodiment, the static random access memory may further include a second set of fins having a fifth fin for a third pull-up transistor, a sixth fin for a fourth pull-up transistor, a seventh fin for a third pass-gate transistor and a third pull-down transistor, and an eighth fin for a fourth pass-gate transistor and a fourth pull-down transistor. The eighth fin of the second set of fins is adjacent to the third fin of the first set of fins.

In one embodiment, the fins are equally spaced apart.

In one embodiment, a distance between a dummy gate and its corresponding fin is a half of a distance between two adjacent fins.

Embodiments of the present invention also provide a method for manufacturing a static random access memory. The method may include providing a substrate structure comprising a substrate, a first set of fins on the substrate and including a first fin for a first pull-up transistor, a second fin for a second pull-up transistor, a third fin for a first pass-gate transistor and a first pull-down transistor, and a fourth fin for a second pass-gate transistor and a second pull-down transistor, a plurality of dummy fins on the substrate, a plurality of gate structures on the first set of fins for forming transistors, etching the fins to form a first recess and a second recess in the fins on opposite sides of the gate structures and the dummy fins to form a third recess in the dummy fins, performing an epitaxial process to form a first epitaxial region in the first recess, a second epitaxial region in the second recess, and a third epitaxial region in the third recess, wherein the third epitaxial region is merged with the first epitaxial region or with the second epitaxial region to form a merged epitaxial region, and forming a contact member on the merged epitaxial region.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

The present inventor proposes in the present disclosure that, when forming fins for an SRAM, at least one fin (referred to as a dummy fin herein) is retained for the formation of a subsequent contact of at least one fin, so that the contact area of the fin can be increased and the contact resistance can be reduced.

Figure 1:
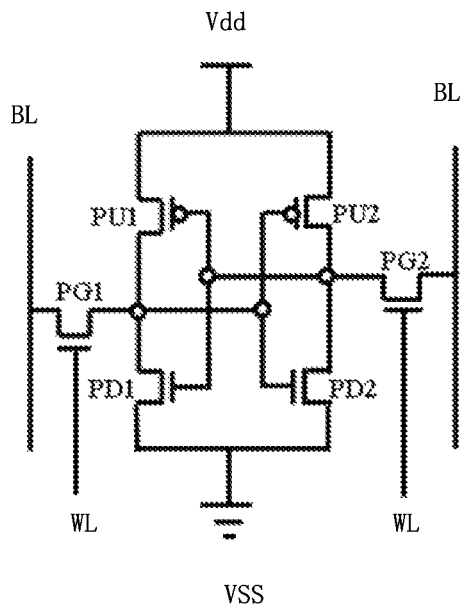
FIG. 1 is a schematic circuit diagram of a conventional SRAM cell that may be applied to embodiments of the present invention.
Figure 2:
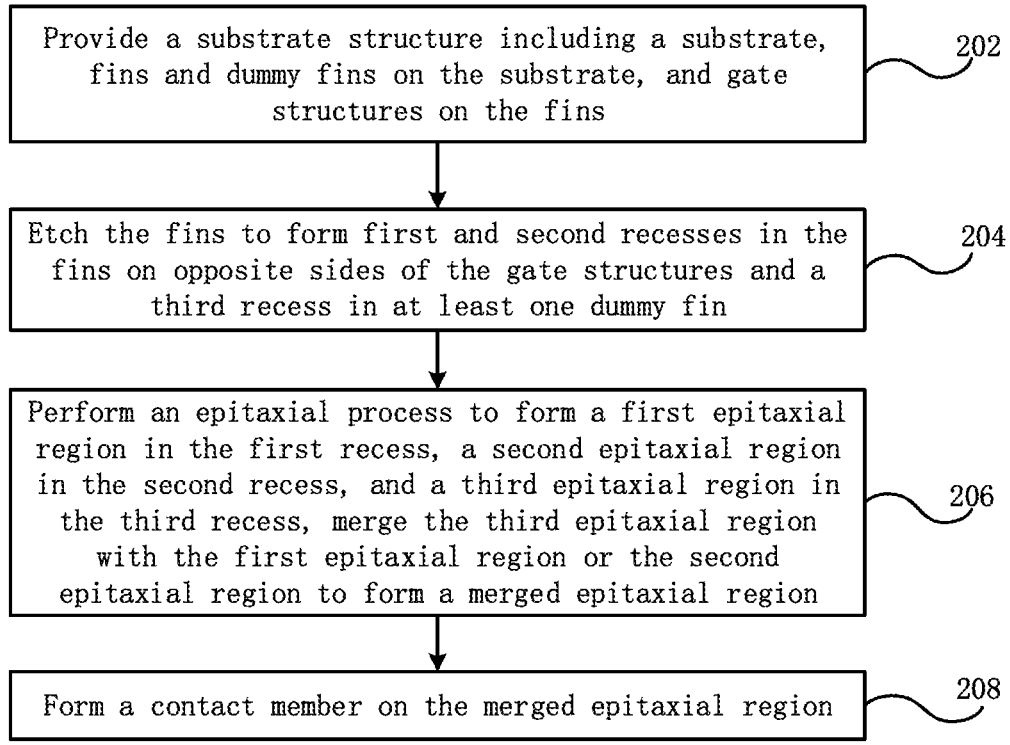
FIG. 2 is a flowchart of a method for manufacturing an SRAM cell according to some embodiments of the present invention.
Figure 3A:
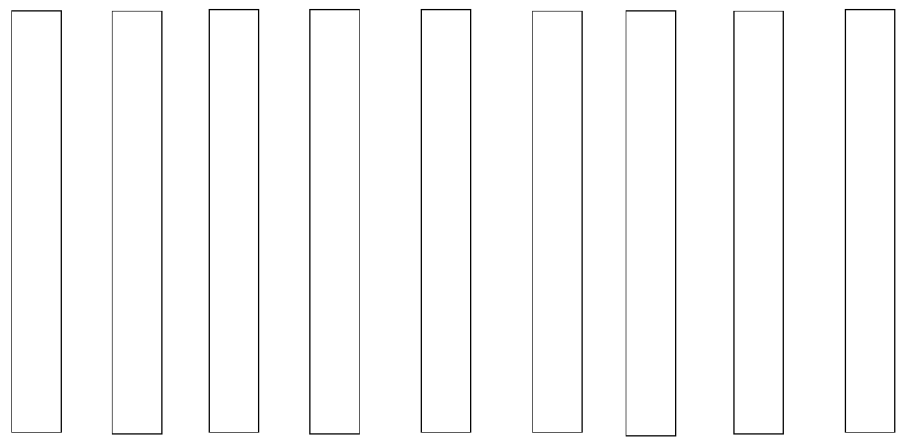
FIGS. 3A to 3C are plan views illustrating intermediate process steps of a method of fabricating an SRAM cell according to some embodiments of the present invention.
Figure 3B:
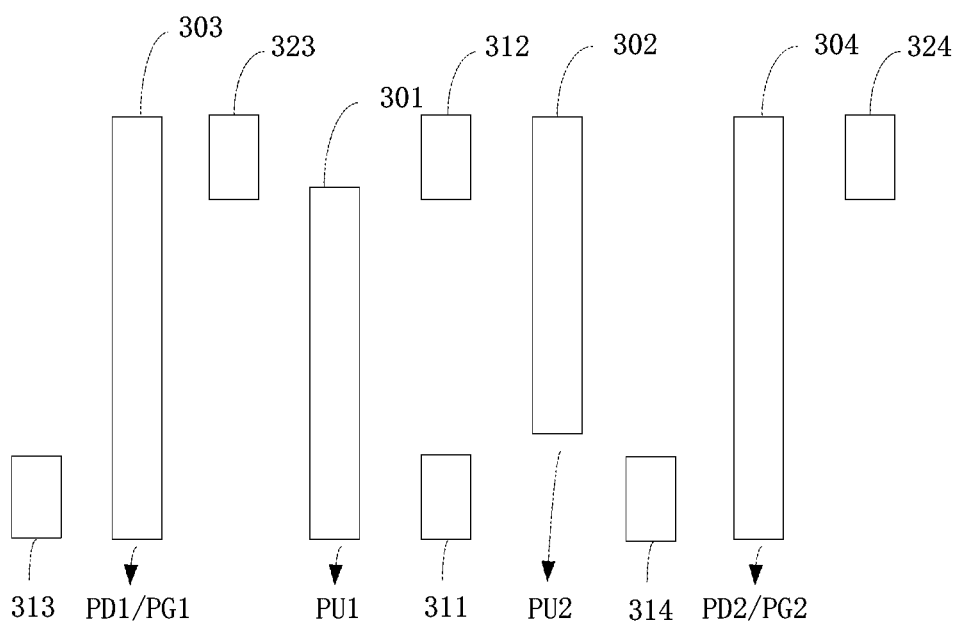
Figure 3C:
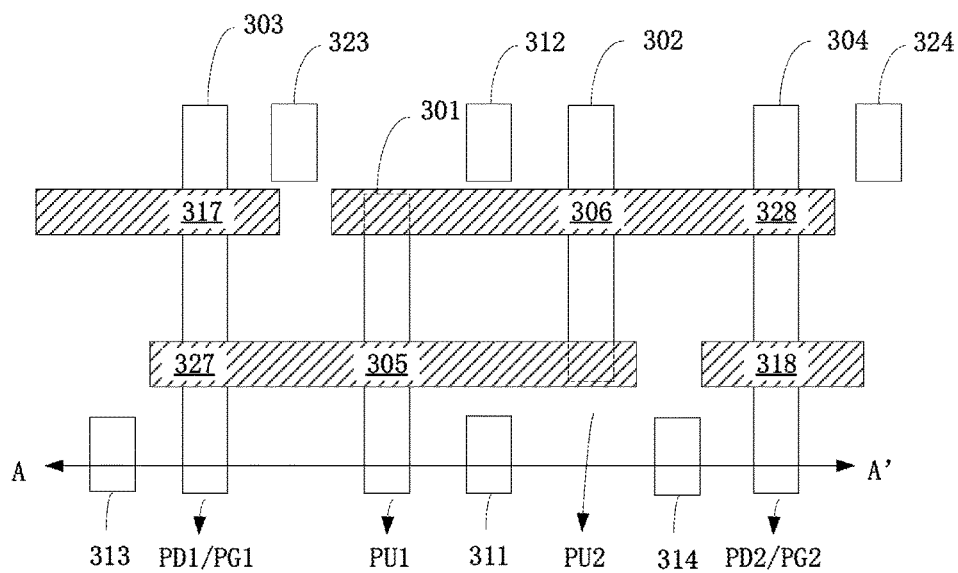

FIG. 2 is a flowchart of a method for manufacturing a static random access memory (SRAM) according to some embodiments of the present invention. FIGS. 3A to 3C are plan views illustrating intermediate process steps of a method for manufacturing a static random access memory according to some embodiments of the present invention. FIGS. 4 to 7 are simplified cross-sectional view illustrating intermediate structures of an SRAM according to some embodiments of the present invention.

A method for manufacturing an SRAM according to an embodiment of the present invention will be described in detail with reference to FIG. 2, FIGS. 3A to 3C, and FIGS. 4 to 7.

Referring to FIG. 2, the method may include providing a substrate structure at step 202.

FIGS. 3A to 3C are plan views illustrating intermediate process steps of a method for manufacturing a static random access memory according to some embodiments of the present invention. Referring to FIG. 3A, a plurality of fins, e.g., nine fins, are formed on a substrate using, e.g., a self-aligned double exposure (SADP) process. The distance between two adjacent fins is the same. The fins are arranged substantially parallel to each other in the longitudinal direction of the fins, that is, in the vertical direction relative to the drawing paper surface.

Referring to FIG. 3B, a cutting process is performed on some of the fins (if necessary) to form a first fin 301 for a first pull-up transistor (hereinafter abbreviated as PU1), a second fin 302 for a second pull-up transistor (hereinafter abbreviated as PU2), a third fin 303 for a first pass-gate transistor (hereinafter abbreviated as PG1) and a first pull-down transistor (hereinafter abbreviated as PD1), and a fourth fin 304 for a second pass-gate transistor (hereinafter abbreviated as PG2) and a second pull-down transistor (hereinafter abbreviated as PD2).

In the embodiment, a dummy fin 311 corresponding to the first fin 301 is formed (retained) next to (adjacent to) the first fin 301. Similarly, a dummy fin 312 corresponding to the second fin 302 is formed (retained) next to (adjacent to) the second fin 301, a dummy fin 313 corresponding to the third fin 303 is formed (retained) next to (adjacent to) the third fin 303, a dummy fin 323 corresponding to the third fin 303 is also formed (retained) adjacent to the third fin 303, a dummy fin 314 corresponding to the fourth fin 303 is formed (retained) adjacent to the fourth fin 304, and a dummy fin 324 corresponding to the fourth fin 304 is also formed (retained) adjacent to the fourth fin 304. The dummy fins can be used for forming contacts for subsequent transistors. In one embodiment, a dummy fin is formed or retained for a corresponding transistor where a contact will be formed.

Referring to FIG. 3C, a gate structure 305 for PU1 is formed on the first fin 301, a gate structure 306 for PU2 is formed on the second fin 302, a gate structure 317 for PG1 and a gate structure 327 for PD1 are formed on the third fin 303, and a gate structure 318 for PG2 and a gate structure 328 for PD2 are formed on the fourth fin 304.

Each gate structure may include at least a gate, such as a polysilicon gate. The gate structure may also include a dielectric layer (e.g., an oxide) between the gate and the corresponding fin. In addition, the gate structure may also include a spacer layer (e.g., oxide, nitride) on both sides of the gate.

It should be noted that, although the gate structure 305 and the gate structure 327 are shown as an entity, and the gate structure 306 and the gate structure 328 are shown as an entity, the example embodiment is to be considered illustrative rather than restrictive. For example, the gate structure 305 and the gate structure 327 can be spaced apart from each other, and the gate structure 305 and the gate structure 327 can then be connected to each other through an additional connection member (e.g., a metal wiring layer).

In one embodiment, to prevent parasitic MOS devices from forming, each dummy fin is disposed on one side of the gate structure on the fin corresponding to the dummy fin. For example, taking the line extending in the direction along the gate structure 327 as a (virtual) boundary line, the dummy gate 313 is disposed in a region below the gate structure 327. Similarly, taking the line extending in the direction along the gate structure 317 as a boundary line, the dummy gate 323 is disposed in a region above the gate structure 317.

Further, it should be noted that each dummy fin may also partially overlap the gate structure on the corresponding fin extending in the direction of the dummy fin, but not exceed (extend beyond) the gate structure. For example, the dummy fin 313 may partially overlap the gate structure 327 extending in the direction of the dummy fin 313, but the dummy fin 313 does not extend beyond the gate structurer 327, that is, the dummy fin 313 cannot be on both the upper side and the lower side of the gate structure 327.

Figure 4:
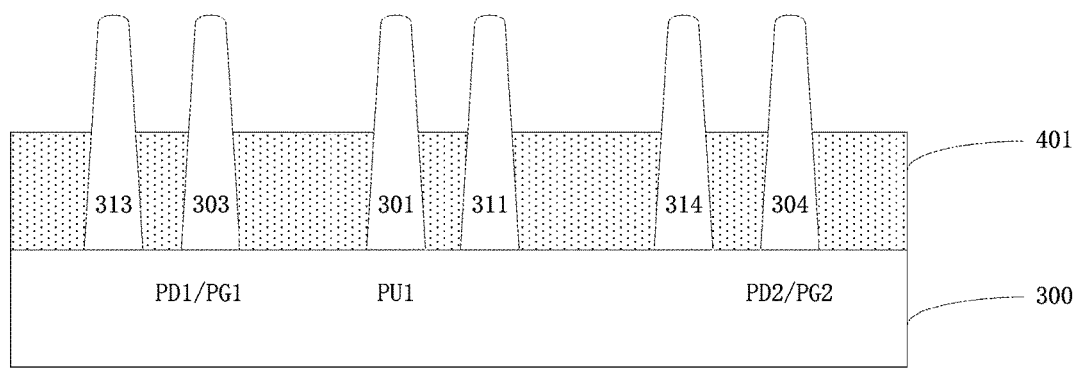
FIGS. 4 to 7 are simplified cross-sectional view illustrating intermediate structures of an SRAM cell according to some embodiments of the present invention.

FIG. 4 is a cross-sectional view of the structure in FIG. 3C taken along the line A-A'. Referring to FIGS. 3C and 4, the substrate structure may include a substrate 300. The substrate 300 may be a silicon substrate, an elemental semiconductor substrate, e.g., a germanium substrate, or a compound semiconductor substrate, e.g., a gallium arsenide substrate.

The substrate structure may also include a first set of fins on the substrate 300 for a SRAM cell. The first set of fins may include a first fin 301 for PU1, a second fin 302 for PU2, a third fin 303 for PG1 and PD1, and a fourth fin 304 for PG2 and PD2. The first, second, third, and fourth fins 301, 302, 303, and 304, are spaced apart from each other. In one embodiment, the first fin 301 and the second fin 304 are disposed between the third fin 303 and the fourth fin 304. In one embodiment, the distance between the fins is the same, i.e., the fins are arranged next to each other at an equal distance, or the fins are equally spaced apart. The fins mays include the same semiconductor material as the material of the substrate 300, or the fins may include a semiconductor material different from the material of the substrate 300.

In one embodiment, PU1 and PU2 may be PMOS transistors, and PD1, PD2, PG1, and PG2 may be NMOS transistors.

The substrate structure may also include at least one dummy fin on the substrate 300, e.g., the dummy fin 313, dummy fin 323, dummy fin 311, dummy fin 312, dummy fin 314, and dummy fin 324. Each dummy fin corresponds to at least one fin and is adjacent to the corresponding fin. For example, the dummy fin 313 corresponds to the third fin 303 and is adjacent to the third fin 303. In one embodiment, the distance between each dummy fin and the fin corresponding to the dummy fin is a half of the distance between two adjacent fins. It should be understood that the distance between two adjacent fins is the distance (spacing) in the lateral direction of the fin and the dummy fin (i.e., the horizontal direction with respect to the drawing paper surface).

The substrate structure may further include an isolation region 401 surrounding each fin and each dummy fin, the isolation region 401 has an upper surface that is lower than the upper surface of each of the fins and each of the dummy fins. The isolation region 401 may include silicon oxide in one exemplary embodiment.

The substrate structure may also include a gate structure for each transistor on each fin. The gate structure has been described in sections above, and the description will not be repeated herein for the sake of brevity.

Figure 5:
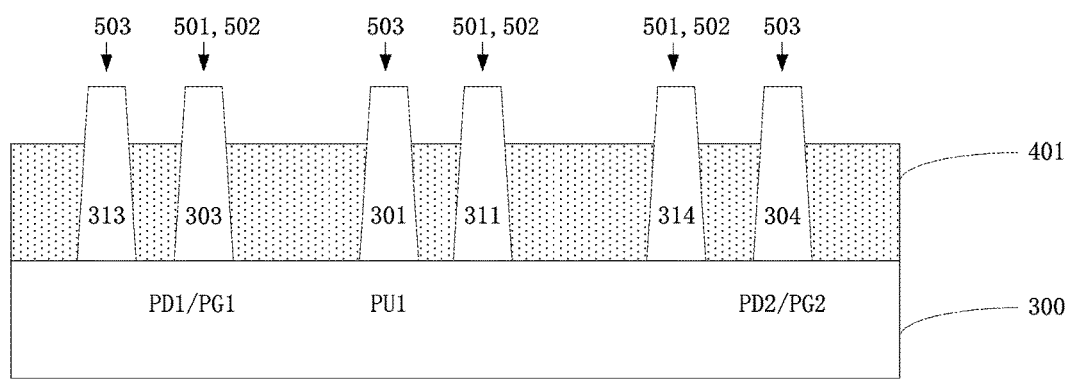

Referring to FIG. 2, at step 204, the method may include etching a portion of the fins to form a first recess 501 and a second recess 502 on opposite sides of each gate structure, and etching the dummy fins to form a third recess 503, as shown in FIG. 5.

Figure 6:
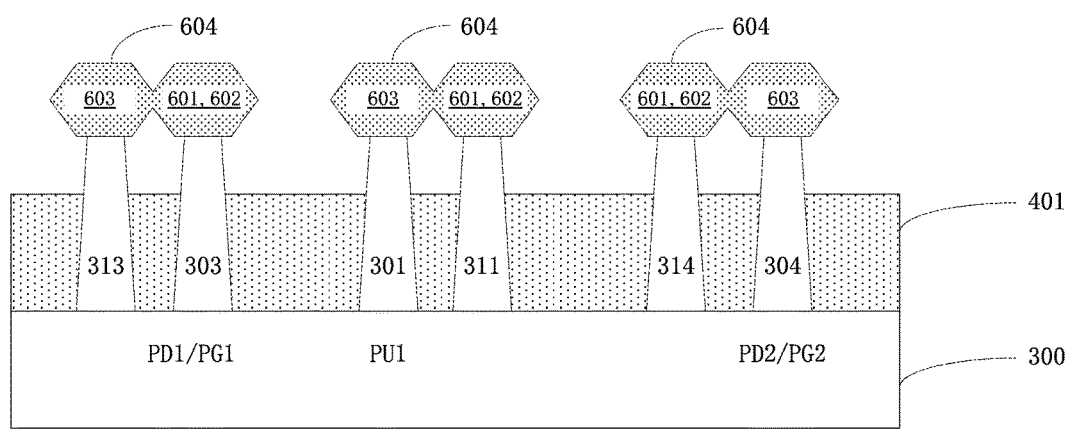

Next, at step 206, the method may include performing an epitaxial growth process to form a first epitaxial region 601 in the first recess 501, a second epitaxial region 602 in the second recess 502, and a third epitaxial region 603 in the third recess 503, as shown in FIG. 6.

The third epitaxial region 603 in each dummy fin merges with the first epitaxial region 601 in the fin corresponding to the dummy fin to form a merged epitaxial region 604, or the third epitaxial region 603 in each dummy fin merges with the second epitaxial region 602 in the fin corresponding to the dummy fin to form a merged epitaxial region 604. In the embodiment, the formed merged epitaxial region 604 may include, for example, a source region of PU1, a source region of PU2, a source region of PG1, a source region of PD1, a source region of PG2, or a source region of PD2.

The two epitaxial regions in the merged epitaxial region 604 may have the same material, that is, the third epitaxial region 603 in each dummy gate and the first epitaxial region 601 or the second epitaxial region 602 that merged with the third epitaxial region 603 may have the same material. In an exemplary embodiment, the first and second epitaxial regions 601 and 602 of PU1 and PU2 may include SiGe, and the first and second epitaxial regions 601 and 602 of PD1, PD2, PG1, and PG2 may include Si. In addition, P dopants may be implanted in-situ to the first and second epitaxial regions 601 and 602 during the epitaxial growth of Si.

Next, at step 208, the method may also include forming a contact member on the merged epitaxial region 604.

In an exemplary embodiment, the method may include forming an interlayer dielectric layer (ILD) 700, e.g., a silicon oxide layer, on the structure shown in FIG. 6. Then, a contact hole (not shown) extending to the merged epitaxial region 604 is formed. Thereafter, a metal material is formed filling the contact hole to form a contact member 701. The contact member 701 formed in contact with the merged epitaxial region 604 may have a larger contact area with the merged epitaxial region 604 than that of the contact formed on the first epitaxial region 601 or the second epitaxial region 602.

Figure 8:
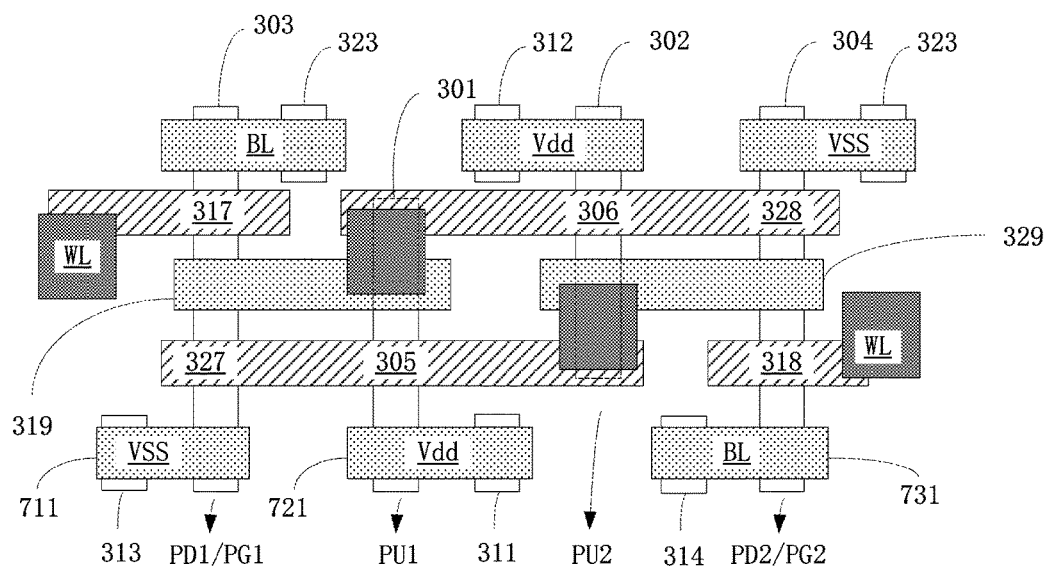
FIG. 8 is a simplified schematic layout diagram of an SRAM cell according to one embodiment of the present invention.

FIG. 8 is a schematic layout diagram of an SRAM cell according to an embodiment of the present invention. The contact member 701 may include, for example, a contact 711 for applying a ground voltage Vss, a contact 721 for applying a power supply voltage Vdd, and a contact 731 for a bit line BL. In addition, FIG. 8 also schematically shows a connector 319 connecting the first fin 301 and the third fin 303, and a connector 329 connecting the second fin 302 and the fourth fin 304. The connectors 319 and 329 may be metal connectors.

The contact member 701 is formed on the merged epitaxial region 601 and has thus a contact area larger than the contact area of a contact member that is only formed on the source/drain region by conventional methods. The larger contact area will reduce the contact resistance.

Figure 9:
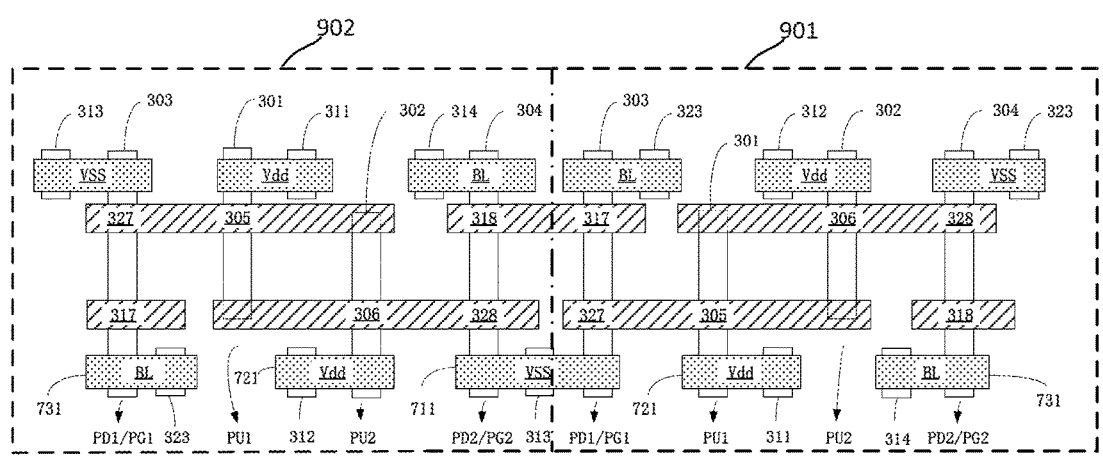
FIG. 9 is a simplified schematic layout diagram of two SRAM cells according to one embodiment of the present invention.

In one embodiment, the substrate structure may also include a second set of fins on the substrate 300 for another SRAM cell according to one embodiment of the present invention. The fins of the second set of fins may be the same as the fins of the first set of fins. In one embodiment, the fourth fin in the second set of fins is adjacent to the third fin in the first set of fins. FIG. 9 shows the schematic layout of two SRAM cells that can be formed through steps 204 to 208.

According to the present invention, at least one dummy fin is formed while forming a corresponding fin for an SRAM. An etching process is performed on the at least one dummy fin and on the corresponding film to form recesses in the dummy fin and the corresponding fin, respectively, an epitaxial region is formed in the recess of the dummy fin and an epitaxial region is formed in the recess of the corresponding fin by an epitaxial growth process. The epitaxial region in the dummy fin and the epitaxial region in the corresponding fin merge into a merged epitaxial region, and a contact member may be formed on the merged epitaxial region. Because the merged epitaxial region combines the epitaxial regions of the dummy fin and the corresponding film, the contact member may have a contact area that is larger than a contact area of the fin made by conventional methods. The larger contact area reduces the contact resistance. In addition, compared with the epitaxial region in a single fin, the merged epitaxial region may also introduce more stress into the channel of the corresponding transistor, thereby increasing the carrier mobility and improving the performance of the transistor. For example, an epitaxially formed SiGe can introduce more compressive stress into the channel of PU1 and PU2 and improve the mobility of holes, while an epitaxially formed Si can introduce more tensile stress into the channel of PD1, PD2, PG1, and PG2 to improve the mobility of electrons.

Figure 7:
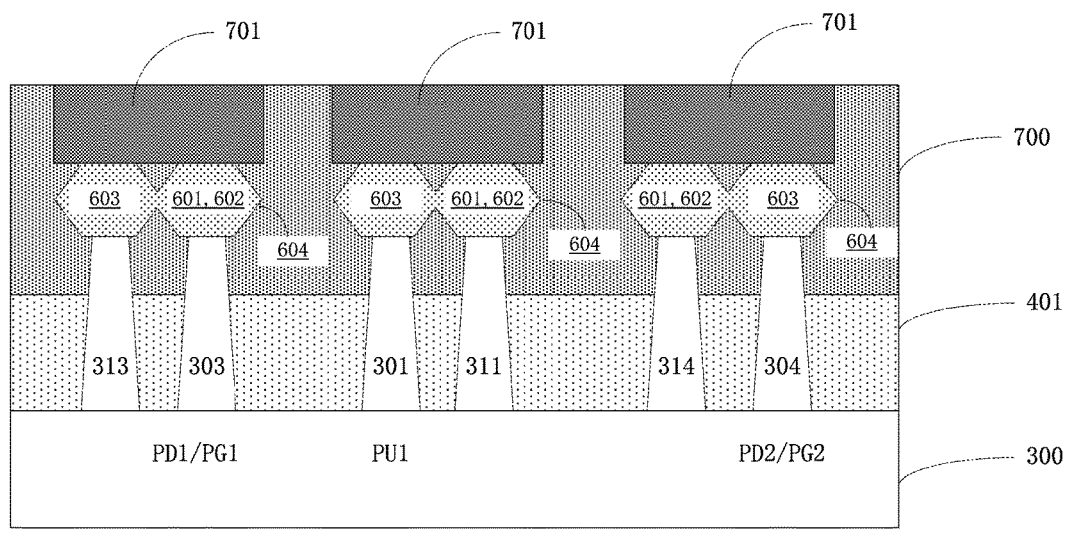

Embodiments of the present invention also provide an SRAM. Referring to FIGS. 5, 7, and 8, the SRAM may include a substrate 300, and a first set of fins on the substrate 300. The first set of fins may include a first fin 301 for PU1, a second fin 302 for PU2, a third fin 303 for PG1 and PD1, and a fourth fin 304 for PG2 and PD2. The first, second, third, and fourth fins are spaced apart from each other. In one embodiment, the first fin 301 and the second fin 302 are disposed between the third fin 303 and the fourth fin 304. In one embodiment, the fins are spaced apart at an equal distance.

In one embodiment, the SRAM may include at least one dummy fin on the substrate 300. For example, the at least one dummy fin may include a dummy fin 311, a dummy fin 313, a dummy fin 314, etc. Each of the dummy fins corresponds to at least one fin and is adjacent to that fin. For example, the dummy fin 311 is adjacent to the corresponding fin 301, and dummy fin 313 is adjacent to the corresponding third fin 303. It should be noted that the dummy fin 313 may also correspond to another fin, e.g., the fourth fin 304 in the second set of fins, as shown in FIG. 9. In other words, two fins can share one dummy fin. In one embodiment, each dummy fin is located on one side of the gate structure on the fin corresponding to the dummy fin. In one embodiment, the distance between a dummy fin and the fin corresponding to that dummy fin is equal to a half of the distance between two adjacent fins.

In one embodiment, the SRAM may also include a gate structure for each transistor on each fin. For example, referring to FIG. 8, the SRAM includes a gate structure 305 for PU1 on the first fin 301, a gate structure 306 for PU2 on the second fin 302, a gate structure 317 for PG1 on the third fin 303, and a gate structure 318 for PD2 on the fourth fin 304.

In one embodiment, referring to FIG. 5, the SRAM may further include a first recess 501 and a second recess 502 in the fins on opposite sides of the gate structure, and a third recess in the at least one dummy fin.

In one embodiment, the SRAM may further include a first epitaxial region 601 that is epitaxially formed in the first recess 501, a second epitaxial region 602 that is epitaxially formed in the second recess 502, and a third epitaxial region 603 that is epitaxially formed in the third recess 503. Herein, the third epitaxial region 603 in each dummy fin merges with the first epitaxial region 601 in the fin corresponding to the dummy fin to form a merged epitaxial region 604, or the third epitaxial region 603 in each dummy fin merges with the second epitaxial region 602 in the fin corresponding to the dummy fin to form a merged epitaxial region 604. In one embodiment, the merged epitaxial region 604 may include a source region of PU1, a source region of PU2, a source region of PG1, a source region of PD1, a source region of PG2, or a source region of PD2.

In one embodiment, the SRAM may further include a contact member 701 on the merged epitaxial region 604.

In one embodiment, the SRAM may further include a second set of fins on the substrate 300 for another SRAM cell. The second set of fins may include a plurality of fins that are the same as the fins of the first set of fins. For example, the second set of fins include a first fin, a second fin, a third fin, and a fourth fin. The fourth fin of the second set of fins is adjacent to the third fin of the first set of fins. FIG. 9 shows an example layout diagram of two SRAM cells. Referring to FIG. 9, the two SRAM cells includes a first SRAM cell 901 and a second SRAM 902. The description of the first SRAM cell 901 has been described in detail in sections above with reference to FIG. 8. The second SRAM cell 901 is a flipped version on the vertical axis of the first SRAM cell 901, and detail description will be omitted because the elements and structures are arranged in the same manner with the case of the first SRAM cell.

It should be noted that in the above description, although each transistor in the SRAM is described as being formed on only one fin as an example, the present invention is not limited thereto. The method and structure provided in the present invention is also applicable and suitable for cases where some transistors are formed in a plurality of fins. For example, in an SRAM, pull-up transistors (PU1 and PU2) are each formed on one fin, and pull-down transistors (PD1 and PD2) and pass-gate transistors (PG1 and PG2) may each be formed in one, two, three, or more fins. For example, the gate structure of one or more transistors PD1, PD2, PG1, and PG2 may straddle (span) over two parallel fins instead of one fin.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical applications. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A static random access memory, comprising:
   a substrate;
   a first set of fins on the substrate and including a first fin for a first pull-up transistor, a second fin for a second pull-up transistor, a third fin for a first pass-gate transistor and a first pull-down transistor, and a fourth fin for a second pass-gate transistor and a second pull-down transistor;
   a plurality of dummy fins on the substrate;
   a plurality of gate structures on the first set of fins for forming transistors;
   first and second recesses in the first set of fins on opposite sides of the gate structures;
   a plurality of third recesses in the dummy fins;
   a first epitaxial region in the first recess;
   a second epitaxial region in the second recess;
   a third epitaxial region in the third recess;

a merged epitaxial region including the third epitaxial region and the first epitaxial region or the third epitaxial region and the second epitaxial region; and a contact member on the merged epitaxial region.

2. The static random access memory of claim 1, wherein a particular dummy fin associated with a particular fin is disposed on one side of a gate structure on the particular fin.

3. The static random access memory of claim 1, wherein the merged epitaxial region comprises a source region of a first pull-up transistor, a source region of a second pull-up transistor, a source region of a first pass-gate transistor, a source region of a first pull-down transistor, a source region of a second pass-gate transistor, or a source region of a second pull-down transistor.

4. The static random access memory of claim 1, wherein the first fin and the second fin are disposed between the third fin and the fourth fin.

5. The static random access memory of claim 1, further comprising a second set of fins having a fifth fin for a third pull-up transistor, a sixth fin for a fourth pull-up transistor, a seventh fin for a third pass-gate transistor and a third pull-down transistor, and an eighth fin for a fourth pass-gate transistor and a fourth pull-down transistor, the eighth fin of the second set of fins being adjacent to the third fin of the first set of fins.

6. The static random access memory of claim 5, wherein the fins are equally spaced apart.

7. The static random access memory of claim 6, wherein a distance between a dummy gate and its corresponding fin is a half of a distance between two adjacent fins.

8. A method for manufacturing a static random access memory, comprising:
   providing a substrate structure comprising:
      a substrate;
      a first set of fins on the substrate and including a first fin for a first pull-up transistor, a second fin for a second pull-up transistor, a third fin for a first pass-gate transistor and a first pull-down transistor, and a fourth fin for a second pass-gate transistor and a second pull-down transistor;
      a plurality of dummy fins on the substrate;
   a plurality of gate structures on the first set of fins for forming transistors;
   etching the fins to form a first recess and a second recess in the fins on opposite sides of the gate structures and the dummy fins to form a third recess in the dummy fins;
   performing an epitaxial process to form a first epitaxial region in the first recess, a second epitaxial region in the second recess, and a third epitaxial region in the third recess, wherein the third epitaxial region is merged with the first epitaxial region or with the second epitaxial region to form a merged epitaxial region; and
   forming a contact member on the merged epitaxial region.

9. The method of claim 8, wherein a particular dummy fin associated with a particular fin is disposed on one side of a gate structure on the particular fin.

10. The method of claim 8, wherein the merged epitaxial region comprises a source region of a first pull-up transistor, a source region of a second pull-up transistor, a source region of a first pass-gate transistor, a source region of a first pull-down transistor, a source region of a second pass-gate transistor, or a source region of a second pull-down transistor.

11. The method of claim 8, wherein the first fin and the second fin are disposed between the third fin and the fourth fin.

12. The method of claim 8, wherein the substrate structure further comprises a second set of fins having a fifth fin for a third pull-up transistor, a sixth fin for a fourth pull-up transistor, a seventh fin for a third pass-gate transistor and a third pull-down transistor, and an eighth fin for a fourth pass-gate transistor and a fourth pull-down transistor, the eighth fin of the second set of fins being adjacent to the third fin of the first set of fins.

13. The method of claim 12, wherein the fins are equally spaced apart.

14. The method of claim 13, wherein a distance between a dummy gate and its corresponding fin is a half of a distance between two adjacent fins.

* * * * *